US012712513B2

(12) United States Patent
Fenchel et al.

(10) Patent No.: US 12,712,513 B2
(45) Date of Patent: Aug. 18, 2026

(54) ELECTRODE STRUCTURE WITH CORROSION RESISTANCE AND POWER DURABILITY

(71) Applicant: RF360 Singapore Pte. Ltd., Singapore (SG)

(72) Inventors: Anja Fenchel, Augsburg (DE); Marc Konstantin Dietrich, Munich (DE); Valentin Albrecht Weippert, Munich (DE); Matthias Honal, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 378 days.

(21) Appl. No.: 18/338,181

(22) Filed: Jun. 20, 2023

(65) Prior Publication Data

US 2024/0429889 A1 Dec. 26, 2024

(51) Int. Cl.

*H03H 3/08* (2006.01)
*H03H 9/145* (2006.01)
*H03H 9/64* (2006.01)

(52) U.S. Cl.

CPC .......... *H03H 3/08* (2013.01); *H03H 9/14541* (2013.01); *H03H 9/6489* (2013.01)

(58) Field of Classification Search

CPC .... H03H 3/08; H03H 9/6489; H03H 9/02559; H03H 9/02574; H03H 9/02929; H03H 9/02937; H03H 9/14541; H03H 9/131; H03H 9/02149

USPC .................................. 333/186–188, 193–196

See application file for complete search history.

(56) References Cited

U.S. PATENT DOCUMENTS

2002/0113526 A1 8/2002 Nishihara
2006/0076851 A1* 4/2006 Fujimoto ........... H03H 9/02818 310/313 R
2011/0156531 A1 6/2011 Tamazaki et al.
2016/0056789 A1 2/2016 Otsubo et al.
2020/0266796 A1 8/2020 Matsuda et al.
2021/0075397 A1 3/2021 Honal et al.

FOREIGN PATENT DOCUMENTS

JP 4359551 B2 11/2009

OTHER PUBLICATIONS

International Search Report and Written Opinion—PCT/SG2024/050332—ISA/EPO—Feb. 4, 2025.
Partial International Search Report—PCT/SG2024/050332—ISA/EPO—Sep. 6, 2024.

* cited by examiner

*Primary Examiner* — Jorge L Salazar, Jr.
(74) *Attorney, Agent, or Firm* — Polsinelli

(57) ABSTRACT

An apparatus for filtering is disclosed that implements an electrode structure with corrosion resistance and power durability. In an example aspect, the apparatus includes an acoustic filter with a piezoelectric layer and the electrode structure. The electrode structure is formed by a metal layer comprising copper and silicon and by an adhesion layer. The adhesion layer is deposited between the metal layer and the piezoelectric layer.

30 Claims, 8 Drawing Sheets

100

102

104

106

Application Processor 108

Computer-Readable Storage Medium 110

Instructions 112

Data 114

I/O Ports 116

Display 118

Wireless Transceiver 120

Acoustic Filter 124

Electrode Structure 134

Antenna 122

Acoustic Filter 124

SAW Filter 126

TFSAW 130

TCSAW 132

BAW Filter 128

Corrosion-Resistant Cu-Based Material 136

FIG. 1

ELECTRODE STRUCTURE WITH CORROSION RESISTANCE AND POWER DURABILITY

TECHNICAL FIELD

This disclosure relates generally to wireless transceivers and other components that employ filters and, more specifically, to implementing an acoustic filter having an electrode structure with corrosion resistance and power durability.

BACKGROUND

Electronic devices use radio-frequency (RF) signals to communicate information. These radio-frequency signals enable users to talk with friends, download information, share pictures, remotely control household devices, and receive global positioning information. To transmit or receive the radio-frequency signals within a given frequency band, the electronic device may use filters to pass signals within the frequency band and to suppress (e.g., attenuate) jammers or noise having frequencies outside of the frequency band. It can be challenging, however, to design a filter that provides filtering for radio-frequency applications, including those that utilize frequencies above 100 megahertz (MHz).

SUMMARY

An apparatus is disclosed that implements an electrode structure with corrosion resistance and power durability. In an example implementation, an acoustic filter includes an electrode structure implemented using a corrosion-resistant copper-based material. The corrosion-resistant copper-based material includes at least a combination of copper and silicon. A quantity of silicon within the electrode structure is sufficient to stabilize the copper and inhibit corrosion damage without significantly increasing sheet resistance. The corrosion-resistant copper-based material can also include one or more other metals, such as silver and/or tin. With the described electrode structure, the acoustic filter can support high-power and/or high-frequency applications and realize a longer life cycle compared to other acoustic filters having an aluminium-based electrode structure or a copper-based electrode structure without silicon. Furthermore, the acoustic filter can realize this longer life cycle without increasing a footprint of the acoustic filter with additional cascaded resonators.

In an example aspect, an apparatus for filtering is disclosed. The apparatus includes an acoustic filter with a piezoelectric layer and an electrode structure. The electrode structure is formed by a metal layer comprising copper and silicon and by an adhesion layer. The adhesion layer is deposited between the metal layer and the piezoelectric layer.

In an example aspect, a method for manufacturing an electrode structure of an acoustic filter is disclosed. The method includes providing an adhesion layer. The method also includes providing a silicon layer and a copper layer on one side of the adhesion layer.

In an example aspect, an apparatus for filtering is disclosed. The apparatus includes an acoustic filter configured to generate a filtered signal from a radio-frequency signal. The acoustic filter includes means for producing a formed acoustic wave. The acoustic filter also includes means for converting the radio-frequency signal to an acoustic wave and converting the formed acoustic wave into the filtered signal. The means for converting includes a metal layer with copper and silicon. The means for converting also includes an adhesion layer deposited between the metal layer and the means for producing the formed acoustic wave.

In an example aspect, an apparatus for filtering is disclosed. The apparatus includes an acoustic filter with a piezoelectric layer and an electrode structure. The electrode structure has a first surface that faces the piezoelectric layer and a second surface that is opposite the first surface. An axis is approximately perpendicular to the first and second surfaces. The electrode structure includes copper atoms. The electrode structure also includes silicon atoms having, along the axis, a higher concentration proximate to the second surface compared to the first surface. The electrode structure additionally includes chromium atoms having, along the axis, a higher concentration proximate to the first surface compared to the second surface.

BRIEF DESCRIPTION OF DRAWINGS

FIG. 4-1 illustrates an example implementation of a thin-film surface-acoustic-wave filter having an electrode structure with corrosion resistance and power durability.

FIG. 4-2 illustrates an example implementation of a temperature-compensated surface-acoustic-wave filter having an electrode structure with corrosion resistance and power durability.

DETAILED DESCRIPTION

Figure 2:
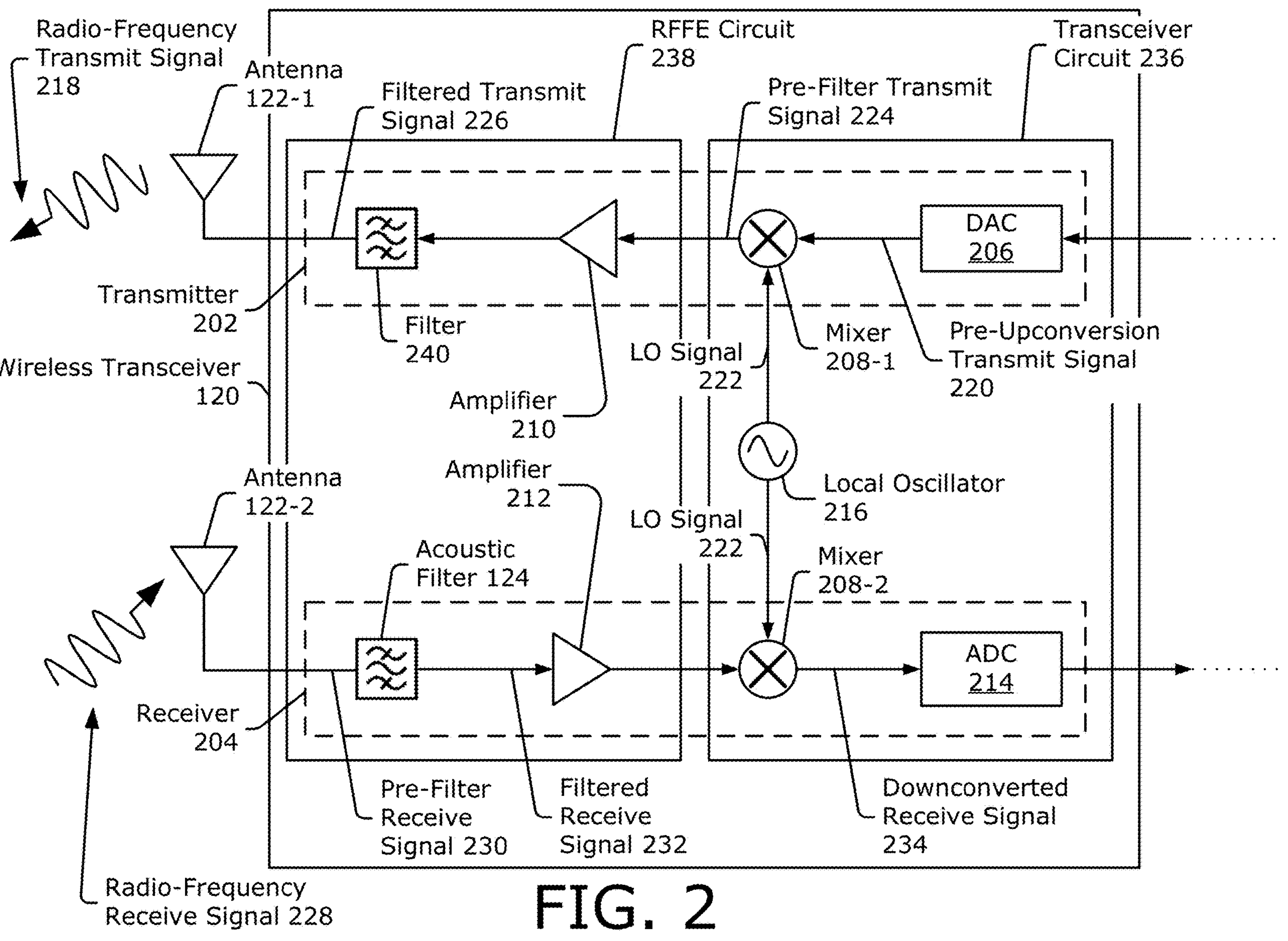
FIG. 2 illustrates an example wireless transceiver including an acoustic filter having an electrode structure with corrosion resistance and power durability.

To transmit or receive radio-frequency signals within a given frequency band, an electronic device may use filters to pass signals within the frequency band and to suppress (e.g., attenuate) jammers or noise having frequencies outside of the frequency band. Electroacoustic devices (e.g., "acoustic filters") can be used to filter high-frequency signals in many applications, such as those with frequencies that are greater than 100 megahertz (MHz). An acoustic filter is tuned to pass certain frequencies (e.g., frequencies within its passband) and attenuate other frequencies (e.g., frequencies that are outside of its passband). Using piezoelectric material as a vibrating medium, the acoustic filter operates by transforming an electrical signal wave that is propagating along an electrical conductor into an acoustic wave (e.g., an acoustic signal wave) that forms across the piezoelectric material. The acoustic wave is then converted back into an electrical filtered signal. The acoustic filter can include an electrode structure that transforms or converts between the electrical and acoustic waves.

The acoustic wave forms across the piezoelectric material and has a velocity with a magnitude that is significantly less than a velocity of an electromagnetic wave. Generally, the magnitude of the velocity of a wave is proportional to a wavelength of the wave. Consequently, after conversion of the electrical signal wave into the acoustic signal wave, the wavelength of the acoustic signal wave is significantly smaller than the wavelength of the electrical signal wave. The resulting smaller wavelength of the acoustic signal wave enables filtering to be performed using a smaller filter device. This permits acoustic filters to be used in space-constrained devices, including portable electronic devices such as cellular phones.

It can be challenging, however, to design an acoustic filter that can support high-power and/or high-frequency applications. Some acoustic filters are designed with copper-based electrode structures, which can have improved power durability performance over aluminum-based electrode structures. Copper, for instance, is stiffer than aluminium and can better withstand the mechanical stress that occurs during an operation of the acoustic filter. As such, the copper-based electrode structure can have a lower likelihood of acoustomigration occurring compared to the aluminium-based electrode structure. Acoustomigration is the movement of atoms that causes the formation of extrusions and/or voids within the electrode structure, which can lead to device failure. Decreasing a likelihood of acoustomigration can lead the electrode structure to have a longer operational duration (e.g., a longer life cycle) before device failure.

Although the copper-based electrode structure can have enhanced power durability compared to the aluminium-based electrode structure, copper can readily corrode due to environmental factors or manufacturing processes. This corrosion can cause the copper-based electrode structure to have a shorter life cycle than desired. Copper-based electrode structures can also have a smaller thickness due to higher mass compared to aluminium-based electrode structures. The smaller thickness can further make the copper-based electrode structure susceptible to corrosion.

Some techniques can adjust the design of the acoustic filter to include a larger quantity of cascaded resonators to realize a target power durability. This, however, increases a size of the acoustic filter and makes it challenging to integrate within space-constrained devices, including mobile devices.

To address these challenges, techniques for implementing an electrode structure with corrosion resistance and power durability are described herein. In an example implementation, an acoustic filter includes an electrode structure implemented using a corrosion-resistant copper-based material. The corrosion-resistant copper-based material includes at least a combination of copper and silicon. A quantity of silicon within the electrode structure is sufficient to stabilize the copper and inhibit corrosion damage without significantly increasing sheet resistance. The corrosion-resistant copper-based material can also include one or more other metals, such as silver and/or tin. With the described electrode structure, the acoustic filter can support high-power and/or high-frequency applications and realize a longer life cycle compared to other acoustic filters having an aluminium-based electrode structure or a copper-based electrode structure without increasing a footprint of the acoustic filter with additional cascaded resonators.

Figure 1:
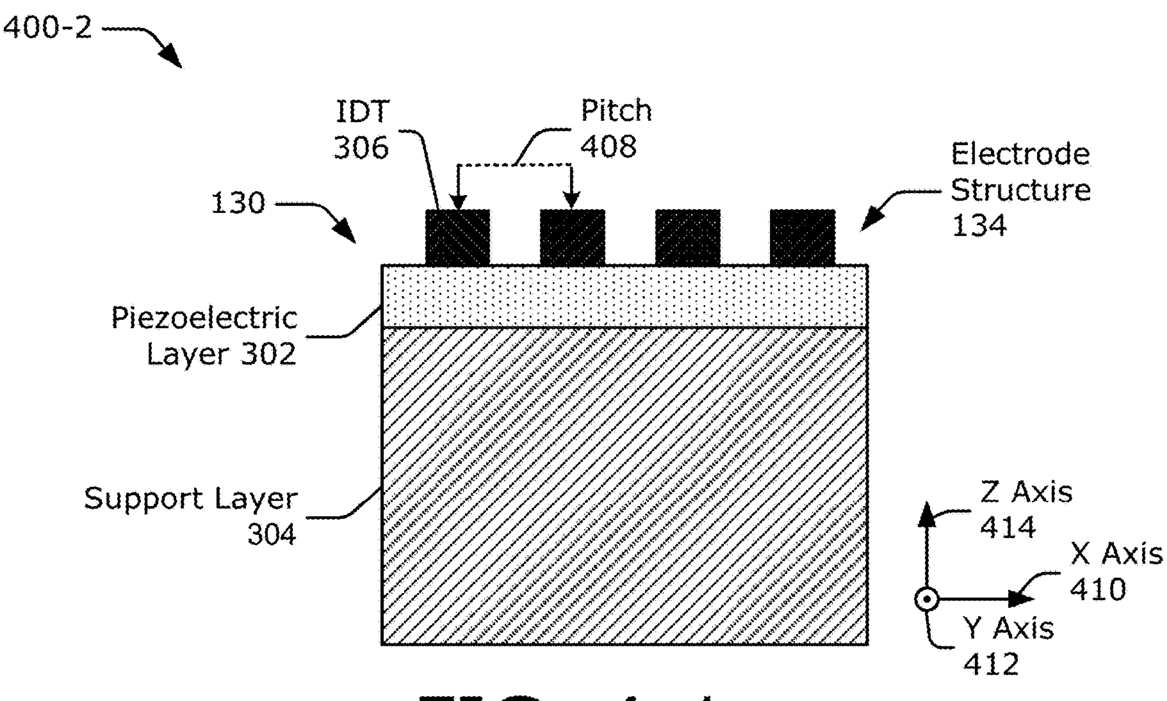
FIG. 1 illustrates an example operating environment for an acoustic filter having an electrode structure with corrosion resistance and power durability.
Figure 4:
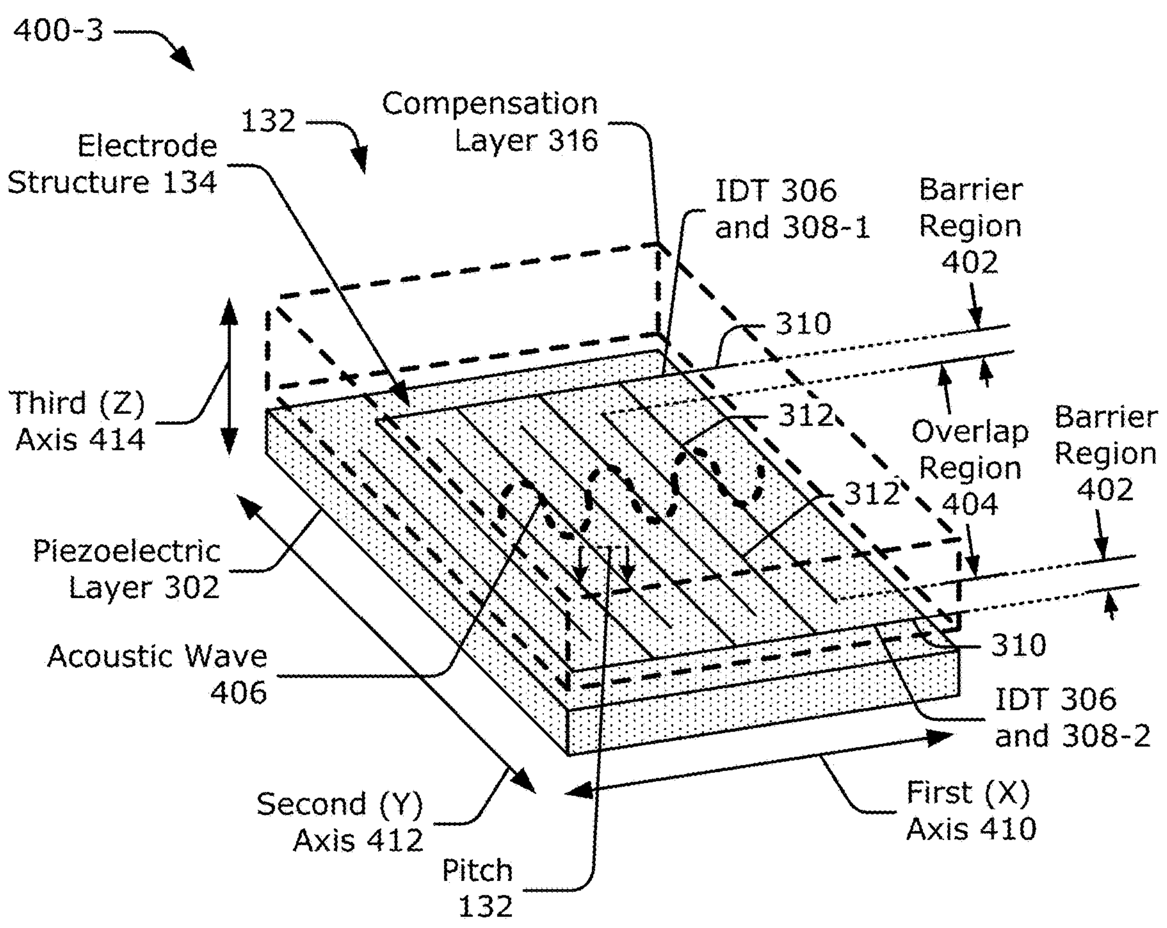
Figure 2:
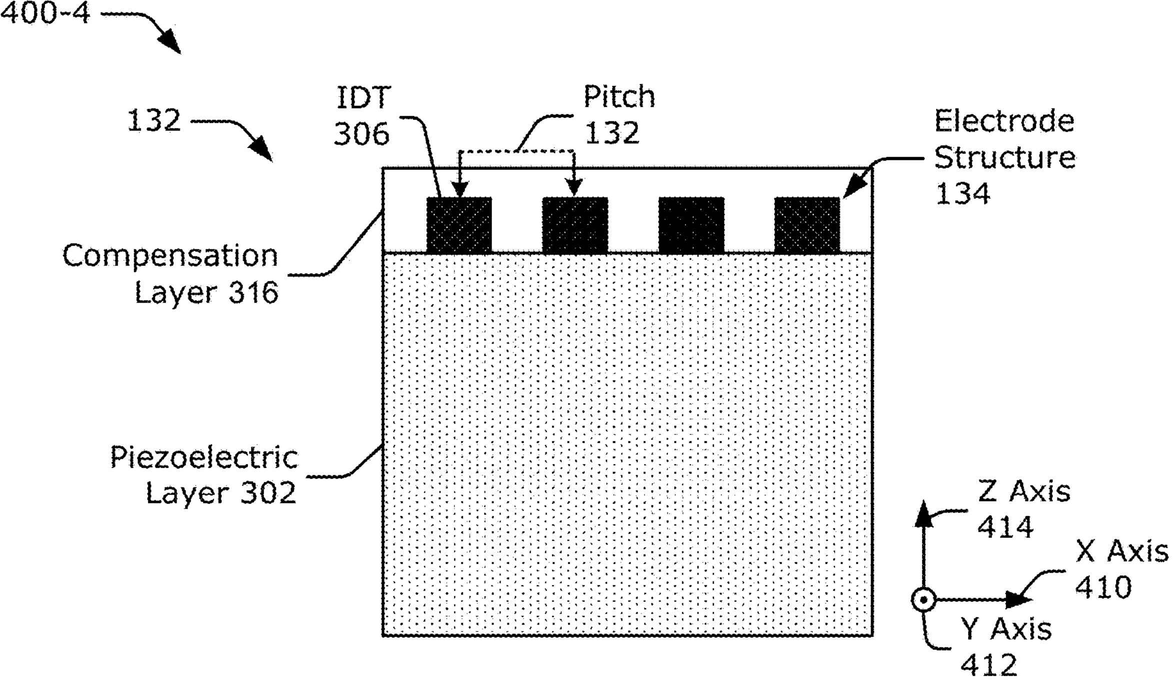

FIG. 1 illustrates an example environment 100 for operating an acoustic filter having an electrode structure with corrosion resistance and power durability. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, and so forth. Therefore, the computing device 102 may communicate with the base station 104 or another device via a wireless connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), or 5th-generation (5G) cellular; IEEE 802.11 (e.g., Wi-Fi®); IEEE 802.15 (e.g., Bluetooth®); IEEE 802.16 (e.g., WiMAX®); and so forth. In some implementations, the wireless link 106 may wirelessly provide power and the base station 104 or the computing device 102 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. The wireless transceiver 120 can facilitate communication over any suitable type of wireless network, such as a wireless local area network (WLAN), peer-to-peer (P2P) network, mesh network, cellular network, ultra-wideband (UWB) network, wireless wide-area-network (WWAN), and/or wireless personalarea-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 122. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 122.

In the example shown in FIG. 1, the wireless transceiver 120 includes at least one acoustic filter 124. The acoustic filter 124 can be implemented using a surface-acoustic-wave filter 126 or a bulk-acoustic-wave filter 128. Example surface-acoustic-wave filters 126 include a thin-film surface-acoustic-wave (TFSAW) filter 130 (TFSAW 130) and a temperature-compensated surface-acoustic-wave (TCSAW) filter 132 (TCSAW 132). Examples of the thin-film surface-acoustic-wave filter 130 and the temperature-compensated surface-acoustic-wave filter 132 are further described with respect to FIGS. 4-1 and 4-2, respectively. Although described with respect to filtering-type applications, the acoustic filter 124 can more generally be referred to as an acoustic transducer, which may be used in other applications besides filtering. For instance, the acoustic transducer can form a portion of a delay line or can be integrated within a piezoelectric sensor.

The acoustic filter 124 includes at least one electrode structure 134. The electrode structure 134 is implemented using a corrosion-resistant copper-based material 136 (corrosion-resistant Cu-based material 136), which is further described with respect to FIG. 5. The corrosion-resistant copper-based material 136 provides sufficient protection against corrosion and acoustomigration, which enables the acoustic filter 124 to be implemented without an additional passivation layer during further processing or without additional cascaded resonators, if desired. With the corrosion-resistant copper-based material 136, the acoustic filter 124 can support high-power and/or high-frequency applications and realize higher power durability and a longer life cycle compared to other acoustic filters that have an aluminium-based electrode structure or a copper-based electrode structure without silicon. The wireless transceiver 120 is further described with respect to FIG. 2.

FIG. 2 illustrates an example wireless transceiver 120. In the depicted configuration, the wireless transceiver 120 includes a transmitter 202 and a receiver 204, which are respectively coupled to a first antenna 122-1 and a second antenna 122-2. In other implementations, the transmitter 202 and the receiver 204 can be connected to a same antenna through a duplexer (not shown). The transmitter 202 is shown to include at least one digital-to-analog converter 206 (DAC 206), at least one first mixer 208-1, at least one amplifier 210 (e.g., a power amplifier), and at least one filter 240. The filter 240 can be implemented using an acoustic filter. The receiver 204 includes the acoustic filter 124, at least one amplifier 212 (e.g., a low-noise amplifier), at least one second mixer 208-2, and at least one analog-to-digital converter 214 (ADC 214). The first mixer 208-1 and the second mixer 208-2 are coupled to a local oscillator 216. Although not explicitly shown, the digital-to-analog converter 206 of the transmitter 202 and the analog-to-digital converter 214 of the receiver 204 can be coupled to the application processor 108 (of FIG. 1) or another processor associated with the wireless transceiver 120 (e.g., a modem).

In some implementations, the wireless transceiver 120 is implemented using multiple circuits (e.g., multiple integrated circuits), such as a transceiver circuit 236 and a radio-frequency front-end (RFFE) circuit 238. As such, the components that form the transmitter 202 and the receiver 204 are distributed across these circuits. As shown in FIG. 2, the transceiver circuit 236 includes the digital-to-analog converter 206 of the transmitter 202, the mixer 208-1 of the transmitter 202, the mixer 208-2 of the receiver 204, and the analog-to-digital converter 214 of the receiver 204. In other implementations, the digital-to-analog converter 206 and the analog-to-digital converter 214 can be implemented on another separate circuit that includes the application processor 108 or the modem. The radio-frequency front-end circuit 238 includes the amplifier 210 of the transmitter 202, the filter 240 of the transmitter 202, the acoustic filter 124 of the receiver 204, and the amplifier 212 of the receiver 204.

During transmission, the transmitter 202 generates a radio-frequency transmit signal 218, which is transmitted using the antenna 122-1. To generate the radio-frequency transmit signal 218, the digital-to-analog converter 206 provides a pre-upconversion transmit signal 220 to the first mixer 208-1. The pre-upconversion transmit signal 220 can be a baseband signal or an intermediate-frequency signal. The first mixer 208-1 upconverts the pre-upconversion transmit signal 220 using a local oscillator (LO) signal 222 provided by the local oscillator 216. The first mixer 208-1 generates an upconverted signal, which is referred to as a pre-filter transmit signal 224. The pre-filter transmit signal 224 can be a radio-frequency signal and include some noise or unwanted frequencies, such as a harmonic frequency. The amplifier 210 amplifies the pre-filter transmit signal 224 and passes the amplified pre-filter transmit signal 224 to the filter 240.

The filter 240 filters the amplified pre-filter transmit signal 224 to generate a filtered transmit signal 226. As part of the filtering process, the filter 240 attenuates the noise or unwanted frequencies within the pre-filter transmit signal 224. The transmitter 202 provides the filtered transmit signal 226 to the antenna 122-1 for transmission. The transmitted filtered transmit signal 226 is represented by the radio-frequency transmit signal 218.

During reception, the antenna 122-2 receives a radio-frequency receive signal 228 and passes the radio-frequency receive signal 228 to the receiver 204. The acoustic filter 124 accepts the received radio-frequency receive signal 228, which is represented by a pre-filter receive signal 230. The acoustic filter 124 filters any noise or unwanted frequencies within the pre-filter receive signal 230 to generate a filtered receive signal 232.

The amplifier 212 of the receiver 204 amplifies the filtered receive signal 232 and passes the amplified filtered receive signal 232 to the second mixer 208-2. The second mixer 208-2 downconverts the amplified filtered receive signal 232 using the local oscillator signal 222 to generate the downconverted receive signal 234. The analog-to-digital converter 214 converts the downconverted receive signal 234 into a digital signal, which can be processed by the application processor 108 or another processor associated with the wireless transceiver 120 (e.g., the modem).

FIG. 2 illustrates one example configuration of the wireless transceiver 120. Other configurations of the wireless transceiver 120 can support multiple frequency bands and share an antenna 122 across multiple transceivers. One of ordinary skill in the art can appreciate the variety of other configurations for which the acoustic filter 124 may be included. For example, the acoustic filter 124 can be integrated within a duplexer or diplexer of the wireless transceiver 120. Also, some implementations of the wireless transceiver 120 can implement the filter 240 using another acoustic filter 124. An example implementation of the acoustic filter 124 is further described with respect to FIG. 3.

Figure 3:
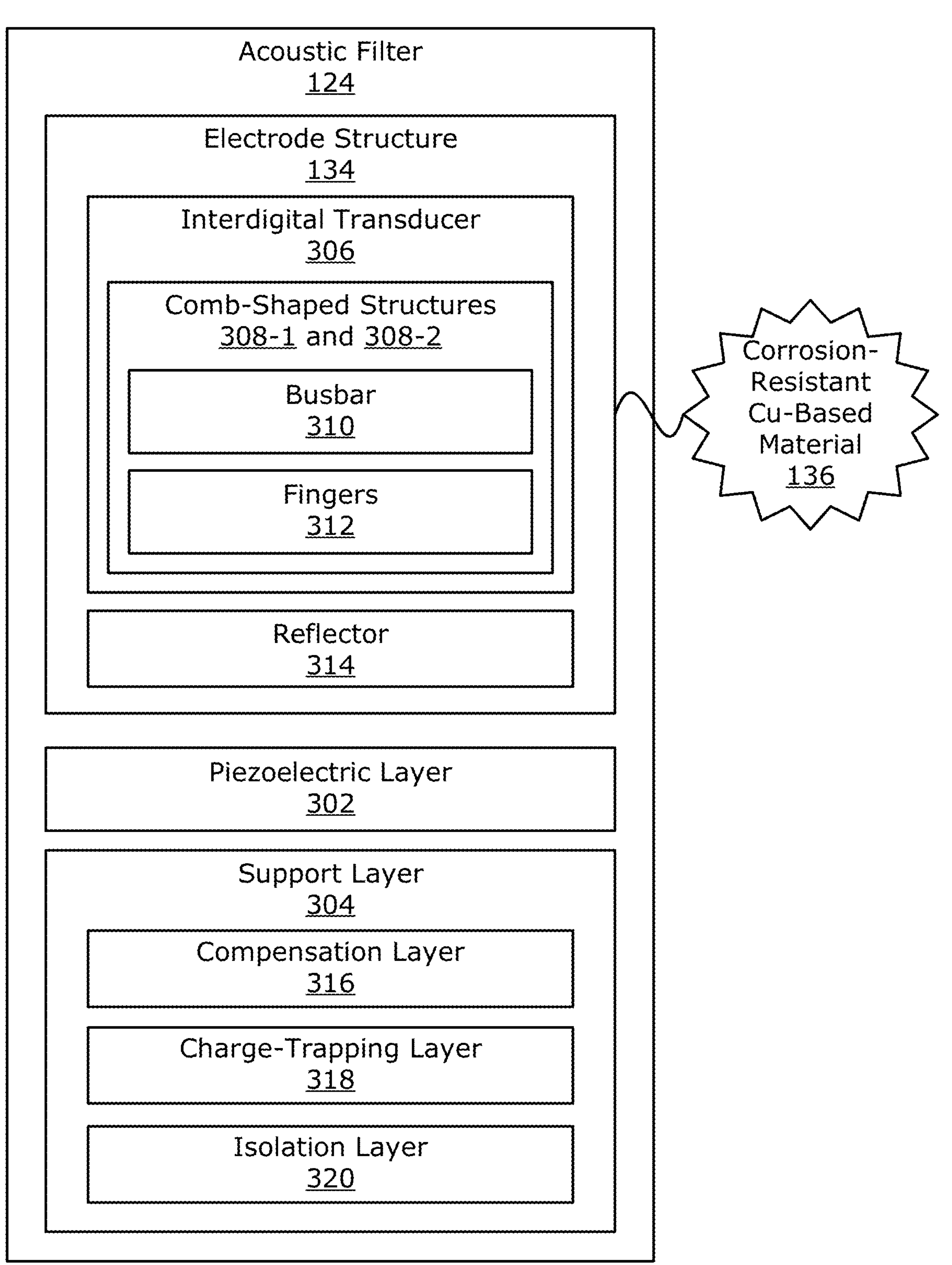
FIG. 3 illustrates example components of an acoustic filter.

FIG. 3 illustrates example components of the acoustic filter 124. In the depicted configuration, the acoustic filter 124 includes at least one electrode structure 134, at least one piezoelectric layer 302, and at least one support layer 304. The electrode structure 134 is formed by the corrosion-resistance copper-based material 136. The corrosion-resistance copper-based material 136 forms at least one metal layer. The electrode structure 134 can also include one or more adhesion layers. The metal and adhesion layers are further described with respect to FIGS. 5 and 6.

The electrode structure 134 can include at least one interdigital transducer 306. The interdigital transducer 306 converts an electrical signal into an acoustic wave and converts the formed acoustic wave into a filtered electrical signal. The interdigital transducer 306 includes two comb-shaped structures 308-1 and 308-2. Each comb-shaped structure 308-1 and 308-2 includes a busbar 310 (e.g., a conductive segment or rail) and multiple fingers 312 (e.g., electrode fingers). The electrode structure 134 can also optionally include two or more reflectors 314. In an example implementation, the interdigital transducer 306 is arranged between two reflectors 314, which reflect the acoustic wave back towards the interdigital transducer 306. Examples of the electrode structure 134 and the interdigital transducer 306 are further described with respect to FIGS. 4-1 and 4-2.

In example implementations, the piezoelectric layer 302 can be implemented using a variety of different materials that exhibit piezoelectric properties (e.g., can transfer mechanical energy into electrical energy or electrical energy into mechanical energy). Example types of material include lithium niobate ($LiNbO_3$), lithium tantalate ($LiTaO_3$), quartz, aluminium nitride (AlN), aluminium scandium nitride (AlScN), or some combination thereof. In general, the material that forms the piezoelectric layer 302 has a crystalline structure. This crystalline structure is defined by an ordered arrangement of particles (e.g., atoms, ions, or molecules).

The support layer 304 includes one or more sublayers that can support passivation, temperature compensation, power handling, mode suppression, and so forth. As an example, the support layer 304 can include at least one compensation layer 316, at least one charge-trapping layer 318, at least one isolation layer 320 (e.g., a base layer), or some combination thereof. These sublayers can be considered part of the support layer 304 or their own separate layers. Depending on the implementation, the piezoelectric layer 302 and/or the support layer 304 can represent a substrate layer of the acoustic filter 124.

The compensation layer 316 can provide temperature compensation to enable the acoustic filter 124 to achieve a target temperature coefficient of frequency based on a thickness of the piezoelectric layer 302. In some implementations, a thickness of the compensation layer 316 can be tailored to provide mode suppression (e.g., suppress a spurious plate mode). The compensation layer 316 can be implemented using at least one silicon dioxide ($SiO_2$) layer, at least one doped silicon dioxide layer, at least one silicon nitride ($Si_3N_4$) layer, at least one silicon oxynitride (SiON) layer, or some combination thereof. In some applications, the support layer 304 may not include, for instance, the compensation layer 316 to reduce cost of the acoustic filter 124.

The charge-trapping layer 318 can trap induced charges at the interface between the compensation layer 316 and another layer associated with the support layer 304 in order to, for example, suppress nonlinear substrate effects. The charge-trapping layer 318 can include at least one polysilicon (poly-Si) layer (e.g., a polycrystalline silicon layer or a multicrystalline silicon layer), at least one amorphous silicon layer, at least one silicon nitride (SiN) layer, at least one silicon oxynitride (SiON) layer, at least one aluminium nitride (AlN) layer, diamond-like carbon (DLC), diamond, or some combination thereof.

The isolation layer 320 can enable the acoustic wave to form across or within the piezoelectric layer 302 and reduce the amount of energy that leaks into the support layer 304. In some implementations, the isolation layer 320 can also act as a compensation layer 316. In general, the isolation layer 320 is composed of material that is non-conducting and provides isolation. For example, the isolation layer 320 can be formed using silicon (Si) material (e.g., a doped high-resistive silicon material), sapphire material (e.g., aluminium oxide ($Al_2O_3$)), silicon carbide (SiC) material, fused silica material, quartz, glass, diamond, or some combination thereof. In some implementations, the isolation layer 320 has a relatively similar thermal expansion coefficient (TEC) as the piezoelectric layer 302. The isolation layer 320 can also have a particular crystal orientation to support the suppression or attenuation of spurious modes. For some implementations of the acoustic filter 124, the isolation layer 320 represents a "bottom" layer of the filter stack.

In some aspects, the acoustic filter 124 can be considered a resonator or formed from multiple resonators. Sometimes the acoustic filter 124 can be connected to other resonators associated with the same or different layer stacks than the acoustic filter 124. The electrode structure 134, the piezoelectric layer 302, and the support layer 304 are further described with respect to FIGS. 4-1 and 4-2.

Figure 4:
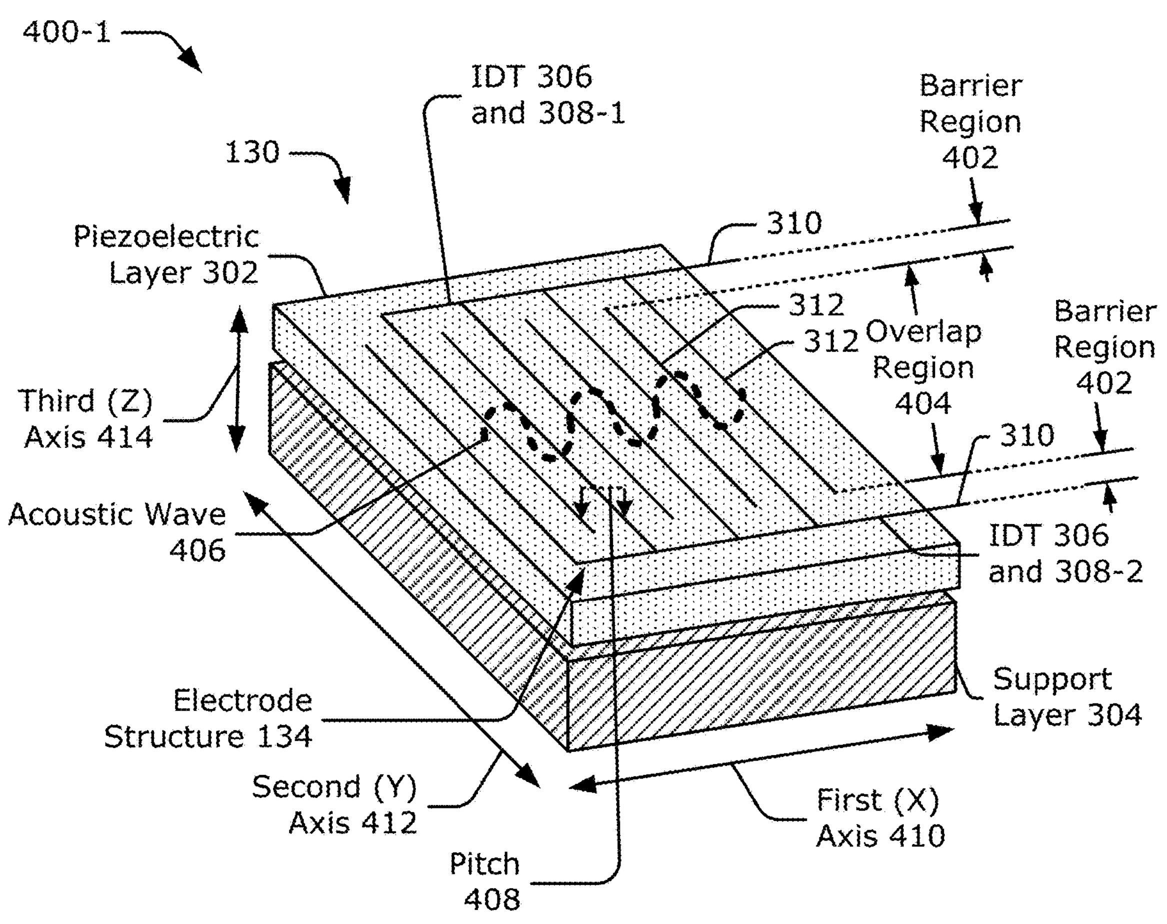

FIG. 4-1 illustrates an example implementation of the acoustic filter 124 as a thin-film surface-acoustic-wave filter 130. A three-dimensional perspective view 400-1 of the thin-film surface-acoustic-wave filter 130 is shown at the top of FIG. 4-1, and a two-dimensional cross-section view 400-2 of the thin-film surface-acoustic-wave filter 130 is shown at the bottom of FIG. 4-1.

The thin-film surface-acoustic-wave filter 130 includes at least one electrode structure 134, at least one piezoelectric layer 302, and at least one support layer 304. In the depicted configuration shown in the two-dimensional cross-section view 400-2, the piezoelectric layer 302 is disposed between the electrode structure 134 and the support layer 304. A portion of the electrode structure 134 depicted in FIG. 4-1 includes at least a portion of the interdigital transducer 306. The electrode structure 134 can include additional interdigital transducers 306 not explicitly shown in FIG. 4-1. Also, the interdigital transducer 306 depicted in FIG. 4-1 can include additional fingers 312 not explicitly shown in FIG. 4-1.

In the three-dimensional perspective view 400-1, the interdigital transducer 306 is shown to have the two comb-shaped structures 308-1 and 308-2 with fingers 312 extending from two busbars 310 towards each other. The fingers 312 are arranged in an interlocking manner in between the two busbars 310 of the interdigital transducer 306 (e.g., arranged in an interdigitated manner). In other words, the fingers 312 connected to a first busbar 310 extend towards a second busbar 310 but do not connect to the second busbar 310. As such, there is a barrier region 402 (e.g., a transversal gap region) between the ends of these fingers 312 and the second busbar 310. Likewise, fingers 312 connected to the second busbar 310 extend towards the first busbar 310 but do not connect to the first busbar 310. There is therefore a barrier region 402 between the ends of these fingers 312 and the first busbar 310.

In the direction along the busbars 310, there is an overlap region 404 where a portion of one finger 312 overlaps with a portion of an adjacent finger 312. This overlap region 404 may be referred to as the aperture, track, or active region where electric fields are produced between fingers 312 to cause an acoustic wave 406 to form at least in this region of the piezoelectric layer 302.

A physical periodicity of the fingers 312 is referred to as the pitch 408 of the interdigital transducer 306. The pitch 408 may be indicated in various ways. For example, in certain aspects, the pitch 408 may correspond to a magnitude of a distance between adjacent fingers 312 of the interdigital transducer 306 in the overlap region 404. This distance may be defined, for example, as the distance between center points of each of the fingers 312. The distance may be generally measured between a right (or left) edge of one finger 312 and the right (or left) edge of an adjacent finger 312 when the fingers 312 have uniform widths. In certain aspects, an average of distances between adjacent fingers 312 of the interdigital transducer 306 may be used for the pitch 408. The frequency at which the piezoelectric layer 302 vibrates is a main-resonance frequency of the electrode structure 134. The frequency is determined at least in part by the pitch 408 of the interdigital transducer 306 and other properties of the thin-film surface-acoustic-wave filter 130.

In the three-dimensional perspective view 400-1, the thin-film surface-acoustic-wave filter 130 is defined by a first (X) axis 410, a second (Y) axis 412, and a third (Z) axis 414. The first axis 410 and the second axis 412 are parallel to a planar surface of the piezoelectric layer 302, and the second axis 412 is perpendicular to the first axis 410. The third axis 414 is normal (e.g., approximately perpendicular or orthogonal) to the planar surface of the piezoelectric layer 302. The busbars 310 of the interdigital transducer 306 are oriented to be parallel to the first axis 410. The fingers 312 of the interdigital transducer 126 are orientated to be parallel to the second axis 412. Also, an orientation of the piezoelectric layer 302 causes the acoustic wave 406 to mainly form in a direction of the first axis 410. As such, the acoustic wave 406 forms in a direction that is substantially perpendicular or orthogonal to the direction of the fingers 312 of the interdigital transducer 306.

FIG. 4-2 illustrates an example implementation of the acoustic filter 124 as a temperature-compensated surface-acoustic-wave filter 132. A three-dimensional perspective view 400-3 of the temperature-compensated surface-acoustic-wave filter 132 is shown at the top of FIG. 4-2, and a two-dimensional cross-section view 400-4 of the temperature-compensated surface-acoustic-wave filter 132 is shown at the bottom of FIG. 4-2.

The temperature-compensated surface-acoustic-wave filter 132 includes at least one electrode structure 134, at least one piezoelectric layer 302, and at least one compensation layer 316. The compensation layer 316 can provide temperature compensation to enable the temperature-compensated surface-acoustic-wave filter 132 to achieve a target temperature coefficient of frequency. In example implementations, the compensation layer 316 can be implemented using at least one silicon dioxide layer.

In the depicted configuration shown in the two-dimensional cross-section view 400-4, the electrode structure 134 is disposed between the piezoelectric layer 302 and the compensation layer 316. The piezoelectric layer 302 can form a substrate of the temperature-compensated surface-acoustic-wave filter 132.

The electrode structure 134 of the temperature-compensated filter 132 can be similar to the electrode structure 134 described above with respect to the thin-film surface-acoustic-wave filter 130 of FIG. 4-1. Likewise, the piezoelectric layer 302 of the temperature-compensated filter 132 can be similar to the piezoelectric layer 302 described above with respect to the thin-film surface-acoustic-wave filter 130 of FIG. 4-1. The piezoelectric layer 302 of the temperature-compensated surface-acoustic-wave filter 132, however, can be thicker than the piezoelectric layer 302 of the thin-film surface-acoustic-wave filter 130 of FIG. 4-1. Similar to the thin-film surface-acoustic-wave filter 130 of FIG. 4-1, the temperature-compensated surface-acoustic-wave filter stack of FIG. 4-2 can also include the barrier region 402 and the central region 404.

One of ordinary skill in the art can appreciate the variety of filter stacks in which the acoustic filter 124 can be implemented. It should be appreciated that while a certain number of fingers 312 are illustrated in FIGS. 4-1 and 4-2, the number of actual fingers and lengths and width of the fingers 312 and busbars 310 may be different in an actual implementation. Such parameters depend on the particular application and desired filter characteristics. In addition, the acoustic filter 124 can include multiple interdigital transducers 306 to achieve a desired filter transfer function.

Implementing the electrode structure 134 using the corrosion-resistance copper-based material 136 can be particularly applicable for implementations that do not include a compensation layer 316 and/or passivation layer disposed on the electrode structure 134. The compensation layer 316 or passivation layer can provide some degree of protection against corrosion. Generally speaking, the techniques for designing an acoustic filter 124 having the electrode structure 134 with corrosion resistance and power durability can apply to filter stacks that do not include the compensation layer 316 (e.g., the thin-film surface-acoustic-wave filter 130 of FIG. 4-1 or a bulk-acoustic-wave filter 128) and filter stacks that include the compensation layer 316 (e.g., the temperature-compensated filter 132 of FIG. 4-2). Aspects of the corrosion-resistant copper-based material 136 are further described with respect to FIG. 5.

Figure 5:
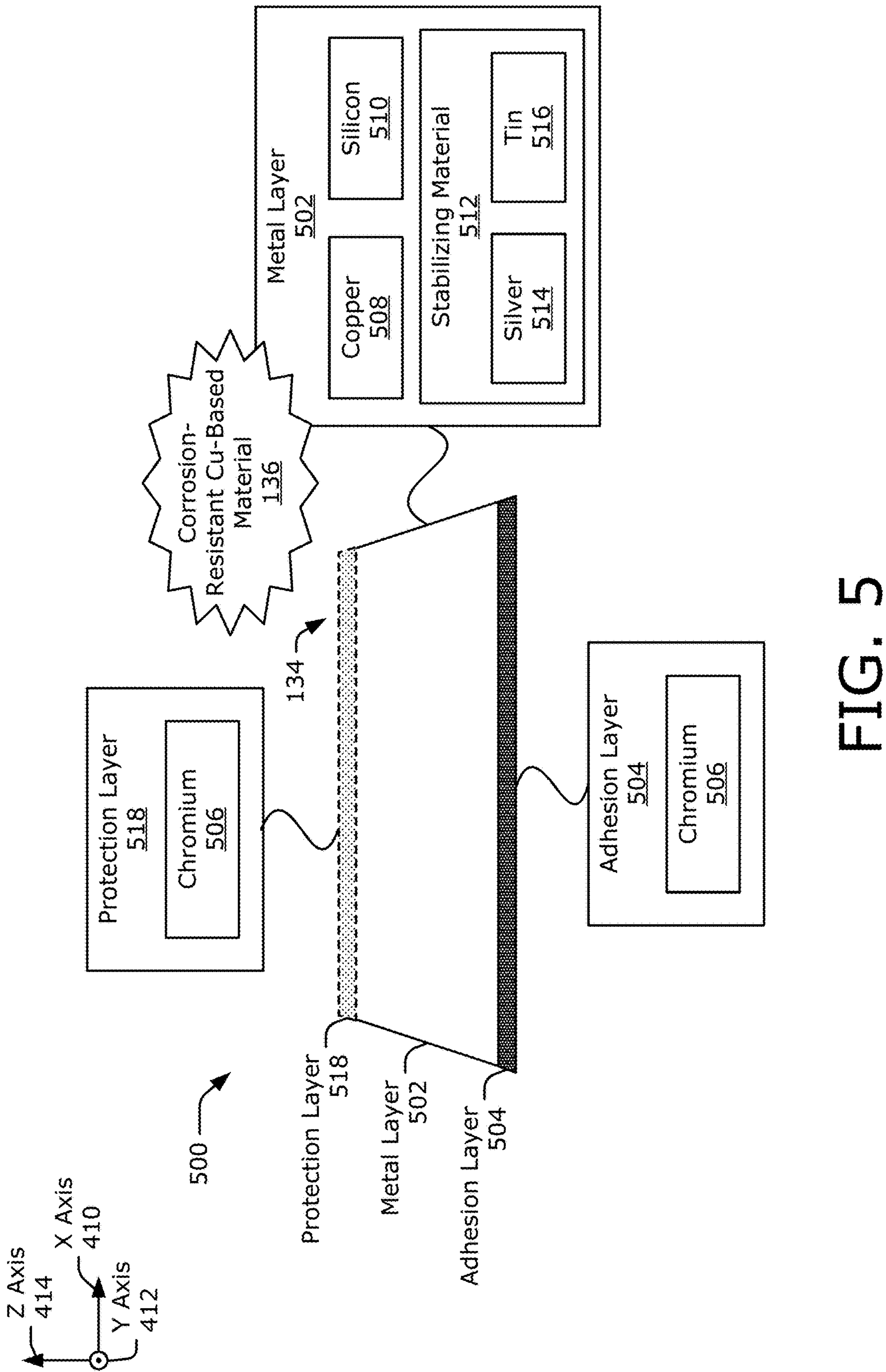
FIG. 5 illustrates example layers of an electrode structure that has corrosion resistance and power durability.

FIG. 5 illustrates examples layers of the electrode structure 134, which has corrosion resistance and power durability. At 500, a two-dimensional cross-sectional view of a portion of the electrode structure 134 is shown. In this example, the portion of the electrode structure 134 corresponds to one of the fingers 312. This two-dimensional cross-sectional view can also apply to other elements of the electrode structure 134, such as the busbar 310 and/or the reflector 314.

As shown at 500, the electrode structure 134 is formed by at least one metal layer 502, at least one adhesion layer 504, and optionally at least one protection layer 518. Although the two-dimensional cross-sectional view in FIG. 5 shows distinct, smooth regions of the metal layer 502, the adhesion layer 504, and the protection layer 518, the surfaces of these layers may not necessarily be smooth. In other words, there can be a certain amount of roughness at the interfaces between these layers. The metal layer 502 includes the corrosion-resistant copper-based material 136, which is further described below.

The adhesion layer 504 bonds the metal layer 502 to other layers in the filter stack, such as the piezoelectric layers 302 in FIGS. 4-1 and 4-2 or another layer that is between the piezoelectric layer 302 and the electrode structure 134. The adhesion layer 504 represents a "bottom" layer of the electrode structure 134. As such, the adhesion layer 504 can be in physical contact with the piezoelectric layer 302 or another layer that is between the piezoelectric layer 302 and the electrode structure 134. The adhesion layer 504 can be implemented using chromium (Cr) 506, titanium (Ti), nickel (Ni), or molybdenum (Mo). In an example implementation, the adhesion layer 504 is formed using chromium 506. The chromium 506 can represent the largest quantity of atoms within the adhesion layer 504.

The optional protection layer 518 can be disposed on the metal layer 502 after at least a portion of the manufacturing processing is performed (e.g., towards the end of front-end processing). The protection layer 518 represents a "top" layer of the electrode structure 134 and can be implemented using chromium 506, titanium, nickel, or molybdenum. In an example implementation, the protection layer 518 is formed using chromium 506. The chromium 506 can represent the largest quantity of atoms within the adhesion layer 504. In addition to providing additional protection for the metal layer 502, the protection layer 518 can further improve the power durability of the acoustic filter 124.

The corrosion-resistance copper-based material 136 that forms the metal layer 502 includes at least copper 508 (e.g., atoms of copper 508) and silicon 510 (e.g., atoms of silicon 510). The copper 508 enables the electrode structure 134 to have a target power durability performance while the silicon 510 enables the electrode structure 134 to resist corrosion. In general, a quantity of copper atoms is significantly greater than a quantity of silicon atoms. As an example, the quantity of silicon atoms can be between approximately 0.5% and 10% the quantity of copper atoms (e.g., between approximately 1% and 5% or equal to approximately 2%). The term "approximately" can mean that the quantities can be within ±2% of a specified value (e.g., within ±1.5%, ±1%, or ±0.5% of the specified value). The copper atoms and the silicon atoms can be distributed within the metal layer 502 along at least a portion of the third axis 414.

The silicon 510 functions as a sacrificial material such that corrosion acts on it instead of the copper 508. For instance, the silicon 510 can be consumed or oxidized by the processes and/or solvents used to manufacture the electrode structure 134. In this manner, the silicon 510 protects the copper 508 from corrosion. Use of the silicon 510 can impact the manufacturing process. In one example, the silicon 510 enables tetrafluoromethane ($CF_4$) plasma or oxygen ($O_2$) plasma to be replaced with argon back-sputtering. In another example, the silicon 510 can help reduce flour-contaminated exhaust, which can be beneficial for net-zero goals.

The metal layer 502 can also include other material, such as at least one stabilizing material 512. The stabilizing material 512 can assist with stabilizing the copper 508 during the manufacturing process and can optionally further improve the power durability. In an example implementation, the stabilizing material 512 includes silver (Ag) 514 (e.g., atoms of silver 514). Other implementations are also possible in which the stabilizing material 512 includes another type of material, such as tin (Sn) 516. Although not explicitly shown, the metal layer 502 can also include other types of electrically-conductive materials, such as aluminium (Al), gold (Au), tungsten (W), platinum (Pt), or some combination or doped version thereof. These other materials can be used to adjust a thickness of the metal layer 502 and/or adjust a weight of the electrode structure 134. The quantity of copper atoms, however, is significantly greater than atoms of any of these other electrically-conductive materials such that the metal layer 502 can be considered to be substantially composed of the corrosion-resistance copper-based material 136.

In an example implementation in which the pitch 408 is approximately a micrometer, a thickness of the adhesion layer 504 can be between approximately 1 and 10 nanometers (e.g., between approximately 1 and 5 nanometers, or approximately equal to 2 nanometers). A thickness of the metal layer 502 can be between approximately 40 and 900 nanometers (e.g., between approximately 60 and 80 nanometers). The term "approximately" can mean that the thicknesses can be within ±2% of a specified value (e.g., within ±1.5%, ±1%, or ±0.5% of the specified value). A thickness of the metal layer 502 can be tailored to achieve a target frequency response.

During the manufacturing process, the materials that form the metal layer 502 and/or the adhesion layer 504 can each be diffused along at least a portion of the third axis 414. Prior to the diffusion, the materials that form the metal layer 502 and/or the materials that form the adhesion layer 504 can be deposited as distinct layers during the manufacturing process, as further described with respect to FIG. 6.

Figure 6:
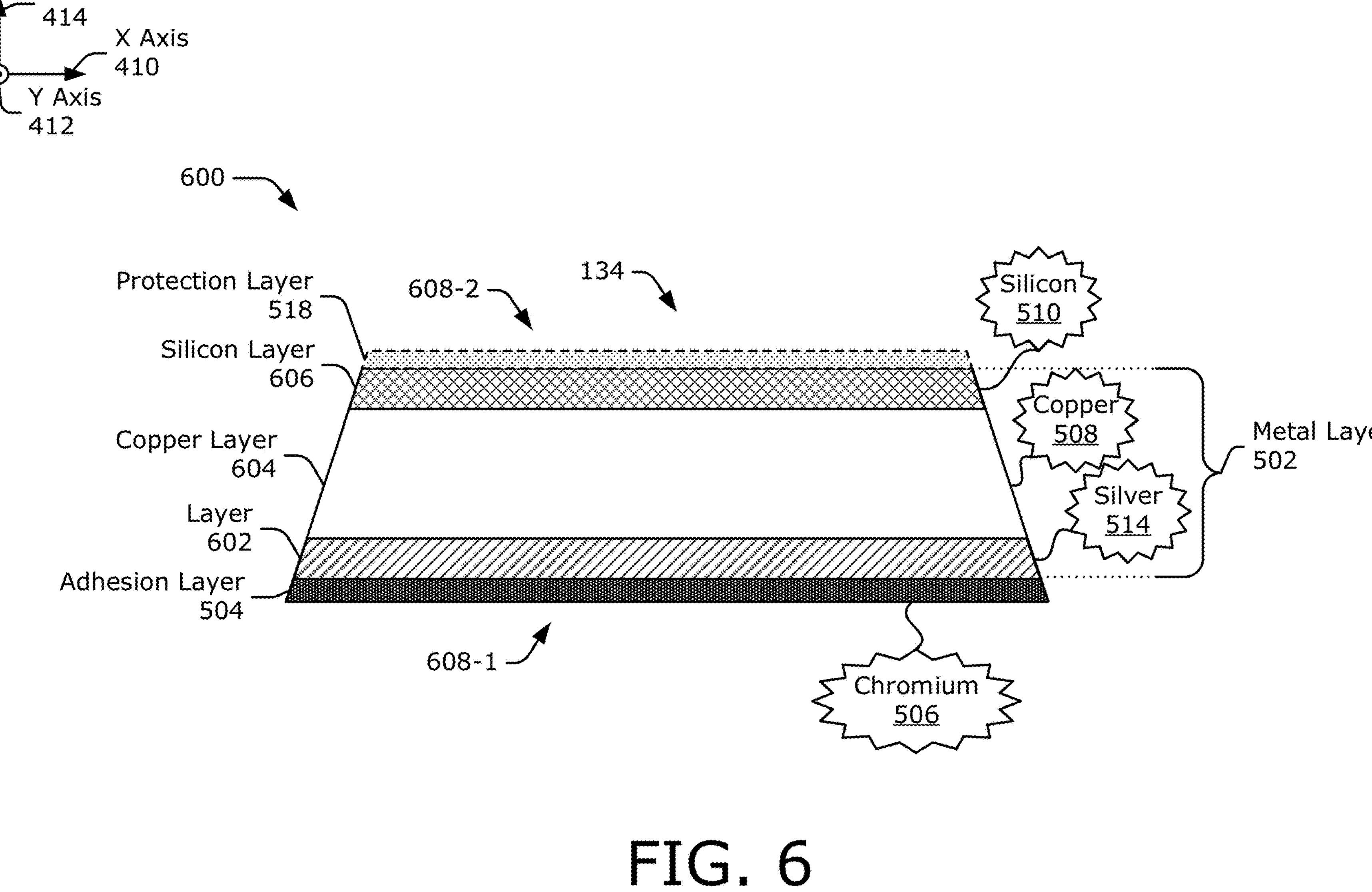
FIG. 6 illustrates an example deposit order of layers of an electrode structure.

FIG. 6 illustrates an example deposit order of layers of the electrode structure 134. At 600, a two-dimensional cross-sectional view of a portion of the electrode structure 134 is shown. In this example, the portion of the electrode structure 134 corresponds to one of the fingers 312. This two-dimensional cross-sectional view can also apply to other elements of the electrode structure 134, such as the busbar 310 and/or the reflector 314.

In the depicted configuration, the metal layer 502 comprises multiple layers, such as at least one layer 602, at least one copper layer 604, and at least one silicon layer 606. The layer 602 is formed using the stabilizing material 512. In an example implementation, the layer 602 includes silver 514 and the adhesion layer 504 includes chromium 506.

During the manufacturing process, the materials that form the metal layer 502 and the adhesion layer 504 can be deposited as layers in a particular order. For example, the chromium 506 can be deposited on the piezoelectric layer 302 (or another layer that is between the piezoelectric layer 302 and the electrode structure 134) to form the adhesion layer 504. In this manner, the adhesion layer 504 represents a first or "bottom" layer of the electrode structure 134. The silver 514 is deposited on "top" of the adhesion layer 504 to form the layer 602, which represents a second layer of the electrode structure 134. The copper 508 is deposited on "top" of the layer 602 to form the copper layer 604, which represents a third layer of the electrode structure 134. The silicon 510 is deposited on "top" of the copper layer 604 to form the silicon layer 606, which represents a fourth layer of the electrode structure 134.

During the manufacturing process, the atoms of silicon 510, copper 508, silver 514, and chromium 506 can at least partially diffuse throughout the electrode structure 134 along the third axis 414. Each type of atom, however, can have a higher concentration within a region associated with the corresponding layer. For example the atoms of copper 508 can be present throughout the metal layer 502 (e.g., within the silicon layer 606 and/or the layer 602), but have a higher concentration within a region associated with the copper layer 604. Also, the silicon 510 and/or the silver 514 can be present throughout the metal layer 502 (e.g., within at least the copper layer 604), but have higher concentrations within the regions associated with the silicon layer 606 and the layer 602, respectively. Explained another way, the concentration of silver 514 can be higher along the third axis 414 proximate to a first surface 608-1 of the electrode structure, which faces the piezoelectric layer 302, compared to a second surface 608-2 that is opposite the first surface 608-1. Also, the concentration of silicon 510 can be higher along the third axis 414 proximate to the second surface 608-2 compared to the first surface 608-1.

Based on the layer order shown in FIG. 6, the chromium 506 and the silver 514 can have higher concentrations proximate to a "bottom" of the electrode structure 134. The silicon 510 can have a higher concentration proximate to a "top" of the electrode structure 134. The copper 508 can have a higher concentration proximate to a "middle" of the electrode structure 134.

Other deposit orders of the layers of the electrode structure 134 are also possible. For example, the layer 602 can be deposited between the copper layer 604 and the silicon layer 606 or can be deposited on "top" of the silicon layer 606. A more complicated order, for instance, can include multiple copper layers 602 and multiple silicon layers 606 that alternate along the third axis 414. Other type of materials can also be deposited within the electrode structure 134. For example, another layer of metal (e.g., aluminium or platinum) can be deposited between the adhesion layer 504 and the copper layer 604 or on "top" of the silicon layer 606.

Figure 7:
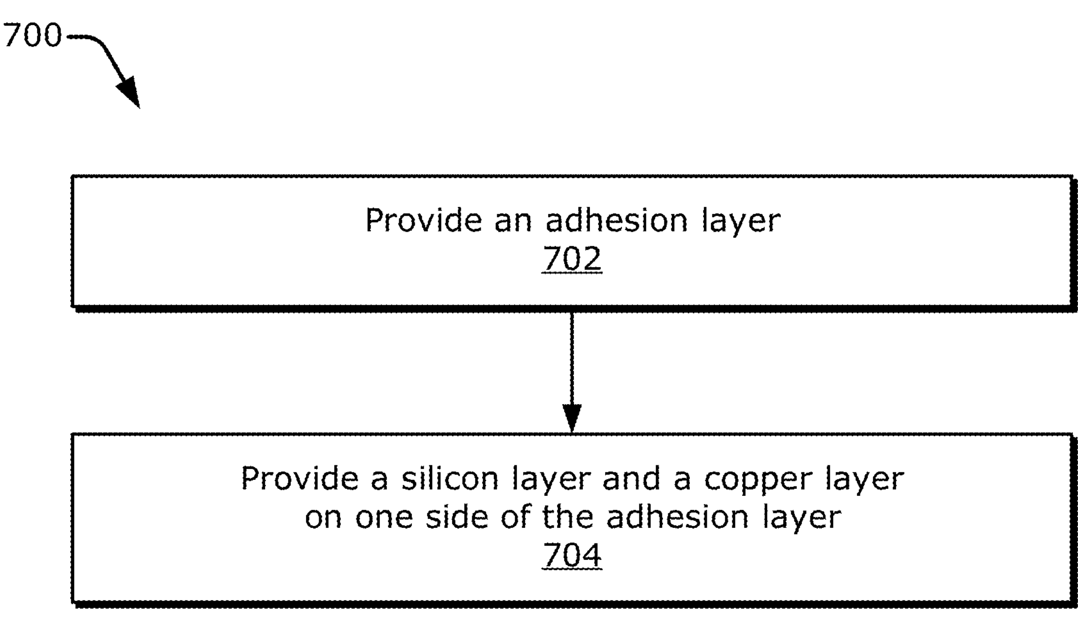
FIG. 7 is a flow diagram illustrating an example process for manufacturing an electrode structure having corrosion resistance and power durability.

FIG. 7 is a flow diagram illustrating an example process 700 for manufacturing an electrode structure with corrosion resistance and power durability. The process 700 is described in the form of a set of blocks 702 and 704 that specify operations that can be performed. However, operations are not necessarily limited to the order shown in FIG. 7 or described herein, for the operations may be implemented in alternative orders or in fully or partially overlapping manners. Also, more, fewer, and/or different operations may be implemented to perform the process 700, or an alternative process. Operations represented by the illustrated blocks of the process 700 may be performed to manufacture at least a portion of an electrode structure 134 (e.g., of FIG. 1 or 3). More specifically, the operations of the process 700 may be performed, at least in part, to manufacture one or more fingers 312 of the electrode structure 134 (e.g., of FIG. 4-1, 4-2, 5, or 6).

At 702, an adhesion layer is provided. For example, the manufacturing process provides the adhesion layer 504, as shown in FIGS. 5 and 6. The adhesion layer 504 enables the copper layer 604 to adhere to another layer of the acoustic filter 124, such as the piezoelectric layer 302 or another layer that is between the piezoelectric layer 302 and the electrode structure 134. In some implementations, the adhesion layer 504 comprises chromium 506.

At 704, a silicon layer and a copper layer is provided on one side of the adhesion layer. For example, the manufacturing process provides the copper layer 604 and the silicon layer 606 on one side (e.g., a "top" side) of the adhesion layer 504, as shown in FIG. 6. In some implementations, a layer 602 of stabilizing material 512 is also provided on the one side of the adhesion layer 504. The copper layer 604 can be positioned between the adhesion layer 504 and the silicon layer 606, and the layer 602 can be positioned between the adhesion layer 504 and the copper layer 604. Other ordered arrangements of the layers 504, 602, 604, and 606 are also possible.

Some aspects are described below.

Aspect 1: An apparatus comprising:
- an acoustic filter comprising:
  - a piezoelectric layer; and
  - an electrode structure formed by:
    - a metal layer comprising copper and silicon; and
    - an adhesion layer deposited between the metal layer and the piezoelectric layer.

Aspect 2: The apparatus of aspect 1, wherein the electrode structure comprises multiple fingers formed by the metal layer and the adhesion layer.

Aspect 3: The apparatus of aspect 1 or 2, wherein the electrode structure comprises at least one busbar formed by the metal layer and the adhesion layer.

Aspect 4: The apparatus of any previous aspect, wherein:
- the copper comprises copper atoms;
- the silicon comprises silicon atoms;
- an axis is approximately perpendicular to two opposite surfaces of the electrode structure and passes through the metal and adhesion layers; and
- the copper atoms and the silicon atoms are distributed within the metal layer along at least a portion of the axis.

Aspect 5: The apparatus of aspect 4, wherein:
- the two opposite surfaces of the electrode structure comprise a first surface that faces the piezoelectric layer and a second surface that is opposite the first surface; and
- a concentration of the silicon atoms along the axis is higher proximate to the second surface compared to the first surface.

Aspect 6: The apparatus of aspect 4 or 5, wherein a quantity of the silicon atoms is between approximately half a percent and ten percent of a quantity of the copper atoms.

Aspect 7: The apparatus of aspect 6, wherein the quantity of the silicon atoms is between approximately one percent and five percent of the quantity of the copper atoms.

Aspect 8: The apparatus of aspect 7, wherein the quantity of the silicon atoms is approximately equal to two percent of the quantity of the copper atoms.

Aspect 9: The apparatus of any previous aspect, wherein the metal layer comprises silver.

Aspect 10: The apparatus of aspect 9, wherein:
- the silver comprises silver atoms;
- an axis is approximately perpendicular to two opposite surfaces of the electrode structure and passes through the metal layer and the adhesion layer;
- the two opposite surfaces comprise a first surface that faces the piezoelectric layer and a second surface that is opposite the first surface; and
- a concentration of the silver atoms along the axis is higher proximate to the first surface compared to the second surface.

Aspect 11: The apparatus of any previous aspect, wherein the adhesion layer comprises chromium.

Aspect 12: The apparatus of any previous aspect, wherein:
- the electrode structure is formed by a protection layer; and
- the metal layer is deposited between the protection layer and the adhesion layer.

Aspect 13: The apparatus of aspect 12, wherein the protection layer comprises chromium.

Aspect 14: The apparatus of any previous aspect, further comprising:
- a wireless transceiver coupled to at least one antenna, the wireless transceiver comprising the acoustic filter and configured to filter, using the acoustic filter, a wireless signal communicated via the at least one antenna.

Aspect 15: The apparatus of any previous aspect, wherein the acoustic filter comprises a surface-acoustic-wave filter.

Aspect 16: The apparatus of aspect 15, wherein the surface-acoustic-wave filter is without a compensation layer disposed on the metal layer of the electrode structure.

Aspect 17: The apparatus of aspect 15 or 16, wherein the surface-acoustic-wave filter comprises a thin-film surface-acoustic-wave filter.

Aspect 18: The apparatus of aspect 15, wherein the surface-acoustic-wave filter comprises a temperature-compensated surface-acoustic-wave filter.

Aspect 19: The apparatus of any one of aspects 1 to 14, wherein the acoustic filter comprises a bulk-acoustic-wave filter.

Aspect 20: A method of manufacturing an electrode structure of an acoustic filter, the method comprising:
- providing an adhesion layer; and
- providing a silicon layer and a copper layer on one side of the adhesion layer.

Aspect 21: The method of aspect 20, wherein:
- the copper layer comprises copper atoms;
- the silicon layer comprises silicon atoms;
- an axis is approximately perpendicular to two opposite surfaces of the electrode structure and passes through the copper layer and the silicon layer; and
- the method further comprises diffusing the copper layer and the silicon layer to distribute the silicon atoms and the copper atoms along at least a portion of the axis.

Aspect 22: The method of aspect 20 or 21, wherein the providing the adhesion layer comprises providing the adhesion layer between a piezoelectric layer of the acoustic filter and the silicon and copper layers.

Aspect 23: The method of any one of aspects 20 to 22, further comprising:
- providing another layer on the one side of the adhesion layer, the other layer comprising a material that provides stabilization for the copper layer.

Aspect 24: An apparatus comprising:
- an acoustic filter configured to generate a filtered signal from a radio-frequency signal, the acoustic filter comprising:
  - means for producing a formed acoustic wave; and
  - means for converting the radio-frequency signal to an acoustic wave and converting the formed acoustic wave into the filtered signal, the means for converting comprising:
    - a metal layer comprising copper and silicon; and
    - an adhesion layer deposited between the metal layer and the means for producing the formed acoustic wave.

Aspect 25: The apparatus of aspect 24, wherein:
- the means for converting has a first surface that faces the means for producing and a second surface that is opposite the first surface;
- the silicon comprises silicon atoms;
- an axis is approximately perpendicular to the first and second surfaces and passes through the metal and adhesion layers; and a concentration of the silicon atoms along the axis is higher proximate to the second surface compared to the first surface.

Aspect 26: The apparatus of aspect 24 or 25, wherein:
- the copper comprises copper atoms;
- the silicon comprises silicon atoms; and
- a quantity of the silicon atoms is between approximately half a percent and ten percent of a quantity of the copper atoms.

Aspect 27: An apparatus comprising:
- an acoustic filter comprising:
  - a piezoelectric layer; and
  - an electrode structure having a first surface that faces the piezoelectric layer and a second surface that is opposite the first surface, an axis being approximately perpendicular to the first and second surfaces, the electrode structure comprising:
    - copper atoms;
    - silicon atoms having, along the axis, a higher concentration proximate to the second surface compared to the first surface; and
    - chromium atoms having, along the axis, a higher concentration proximate to the first surface compared to the second surface.

Aspect 28: The apparatus of aspect 27, wherein a quantity of the silicon atoms is between approximately half a percent and ten percent of a quantity of the copper atoms.

Aspect 29: The apparatus of aspect 27 or 28, wherein the electrode structure comprises silver atoms having, along the axis, a higher concentration proximate to the first surface compared to the second surface.

Aspect 30: The apparatus of any one of aspects 27 to 29, wherein the silicon atoms are distributed between at least a portion of the copper atoms.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:

an acoustic filter comprising:

a piezoelectric layer; and an electrode structure formed by:

a metal layer comprising a combination of copper and silicon, wherein the copper forms a first part of the metal layer and the silicon forms a second part of the metal layer; and an adhesion layer deposited between the metal layer and the piezoelectric layer.

2. The apparatus of claim 1, wherein the electrode structure comprises multiple fingers formed by the metal layer and the adhesion layer.

3. The apparatus of claim 1, wherein the electrode structure comprises at least one busbar formed by the metal layer and the adhesion layer.

4. The apparatus of claim 1, wherein:

the copper comprises copper atoms;

the silicon comprises silicon atoms;

an axis is approximately perpendicular to two opposite surfaces of the electrode structure and passes through the metal layer and the adhesion layer;

the copper atoms are distributed within the first part of the metal layer along at least a portion of the axis, and the silicon atoms are distributed within the second part of the metal layer along at least the portion of the axis.

5. The apparatus of claim 4, wherein:

the two opposite surfaces of the electrode structure comprise a first surface that faces the piezoelectric layer and a second surface that is opposite the first surface; and a concentration of the silicon atoms along the axis is higher proximate to the second surface compared to the first surface.

6. The apparatus of claim 4, wherein a quantity of the silicon atoms is between approximately half a percent and ten percent of a quantity of the copper atoms.

7. The apparatus of claim 6, wherein the quantity of the silicon atoms is between approximately one percent and five percent of the quantity of the copper atoms.

8. The apparatus of claim 7, wherein the quantity of the silicon atoms is approximately equal to two percent of the quantity of the copper atoms.

9. The apparatus of claim 1, wherein the metal layer comprises silver.

10. The apparatus of claim 9, wherein:

the silver comprises silver atoms;

an axis is approximately perpendicular to two opposite surfaces of the electrode structure and passes through the metal layer and the adhesion layer;

the two opposite surfaces comprise a first surface that faces the piezoelectric layer and a second surface that is opposite the first surface; and a concentration of the silver atoms along the axis is higher proximate to the first surface compared to the second surface.

11. The apparatus of claim 1, wherein the adhesion layer comprises chromium.

12. The apparatus of claim 1, wherein:

the electrode structure is formed by a protection layer; and the metal layer is deposited between the protection layer and the adhesion layer, wherein the protection layer is formed over the second part of the metal layer.

13. The apparatus of claim 12, wherein the protection layer comprises chromium.

14. The apparatus of claim 1, further comprising:

a wireless transceiver coupled to at least one antenna, the wireless transceiver comprising the acoustic filter and configured to filter, using the acoustic filter, a wireless signal communicated via the at least one antenna.

15. The apparatus of claim 1, wherein the acoustic filter comprises a surface-acoustic-wave filter.

16. The apparatus of claim 15, wherein the surface-acoustic-wave filter is without a compensation layer disposed on the metal layer of the electrode structure.

17. The apparatus of claim 15, wherein the surface-acoustic-wave filter comprises a thin-film surface-acoustic-wave filter.

18. The apparatus of claim 15, wherein the surface-acoustic-wave filter comprises a temperature-compensated surface-acoustic-wave filter.

19. The apparatus of claim 1, wherein the acoustic filter comprises a bulk-acoustic-wave filter.

20. The apparatus of claim 1, wherein a quantity of copper atoms in the first part of the metal layer is greater than a quantity of silicon atoms in the second part of the metal layer.

21. A method of manufacturing an electrode structure of an acoustic filter, the method comprising:

providing an adhesion layer; and providing a metal layer including a combination of a silicon layer and a copper layer on one side of the adhesion layer, wherein the copper layer forms a first part of the metal layer and the silicon layer forms a second part of the metal layer.

22. The method of claim 21, wherein the providing the adhesion layer comprises providing the adhesion layer between a piezoelectric layer of the acoustic filter and the silicon layer and the copper layer.

23. The method of claim 21, further comprising:

providing an additional layer on the one side of the adhesion layer, the additional layer comprising a material that provides stabilization for the copper layer.

24. The method of claim 21, wherein:

the copper layer comprises copper atoms;

the silicon layer comprises silicon atoms;

an axis is approximately perpendicular to two opposite surfaces of the electrode structure and passes through the copper layer and the silicon layer; and the method further comprises diffusing the copper layer and the silicon layer to distribute the silicon atoms within the second part of the metal layer and the copper atoms within the first part of the metal layer along at least a portion of the axis.

25. An apparatus comprising:

an acoustic filter comprising:

a piezoelectric layer; and an electrode structure having a first surface that faces the piezoelectric layer and a second surface that is opposite the first surface, an axis being approximately perpendicular to the first surface and the second surface, the electrode structure comprising:

copper atoms forming a first part of the electrode structure;

silicon atoms forming a second part of the electrode structure, the silicon atoms having, along the axis, a higher concentration proximate to the second surface compared to the first surface, wherein the silicon atoms are distributed between at least a portion of the copper atoms; and chromium atoms having, along the axis, a higher concentration proximate to the first surface compared to the second surface.

26. The apparatus of claim 25, wherein a quantity of the silicon atoms is between approximately half a percent and ten percent of a quantity of the copper atoms.

27. The apparatus of claim 25, wherein the electrode structure comprises silver atoms having, along the axis, a higher concentration proximate to the first surface compared to the second surface.

28. An apparatus comprising:

an acoustic filter comprising:

a piezoelectric layer; and an electrode structure formed by:

a metal layer comprising copper and silicon, wherein the copper comprises copper atoms and the silicon comprises silicon atoms, and wherein a quantity of the silicon atoms is between approximately half a percent and ten percent of a quantity of the copper atoms; and an adhesion layer deposited between the metal layer and the piezoelectric layer;

wherein:

an axis is approximately perpendicular to two opposite surfaces of the electrode structure and passes through the metal layer and the adhesion layer; and the copper atoms and the silicon atoms are distributed within the metal layer along at least a portion of the axis.

29. The apparatus of claim 28, wherein the electrode structure comprises multiple fingers formed by the metal layer and the adhesion layer.

30. The apparatus of claim 28, wherein the electrode structure comprises at least one busbar formed by the metal layer and the adhesion layer.

* * * * *